(12) United States Patent
Delgadino et al.

(10) Patent No.: US 8,394,722 B2
(45) Date of Patent: Mar. 12, 2013

(54) BI-LAYER, TRI-LAYER MASK CD CONTROL

(75) Inventors: Gerardo A. Delgadino, Santa Clara, CA (US); Robert C. Hefty, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 1164 days.

(21) Appl. No.: 12/263,662

(22) Filed: Nov. 3, 2008

(65) Prior Publication Data

US 2010/0108264 A1 May 6, 2010

(51) Int. Cl.
*H01L 21/461* (2006.01)
*H01L 21/306* (2006.01)

(52) U.S. Cl. .............. 438/710; 216/47; 216/49; 216/67; 216/72

(58) Field of Classification Search ......................... None
See application file for complete search history.

(56) References Cited

U.S. PATENT DOCUMENTS

| | | | |
|---|---|---|---|
| 5,376,228 A | 12/1994 | Yanagida | |
| 5,376,234 A * | 12/1994 | Yanagida | 438/695 |
| 5,419,809 A | 5/1995 | Nagayama et al. | |
| 6,187,688 B1 * | 2/2001 | Ohkuni et al. | 438/725 |
| 7,645,707 B2 * | 1/2010 | Rusu et al. | 438/723 |
| 8,133,819 B2 * | 3/2012 | Wang et al. | 438/725 |
| 2004/0222185 A1 | 11/2004 | Kawai | |
| 2006/0226120 A1 * | 10/2006 | Rusu et al. | 216/67 |
| 2007/0026677 A1 * | 2/2007 | Ji et al. | 438/689 |
| 2007/0298616 A1 * | 12/2007 | Kim et al. | 438/700 |
| 2009/0163028 A1 * | 6/2009 | Jung | 438/703 |
| 2009/0212010 A1 * | 8/2009 | Wang et al. | 216/47 |
| 2009/0215272 A1 * | 8/2009 | Sadjadi et al. | 438/703 |
| 2010/0108264 A1 * | 5/2010 | Delgadino et al. | 156/345.35 |
| 2010/0327413 A1 * | 12/2010 | Lee et al. | 257/618 |
| 2011/0053379 A1 * | 3/2011 | Chi et al. | 438/710 |
| 2012/0052683 A1 * | 3/2012 | Kim et al. | 438/694 |

* cited by examiner

*Primary Examiner* — Allan Olsen
(74) *Attorney, Agent, or Firm* — Beyer Law Group LLP

(57) ABSTRACT

A method for controlling critical dimension (CD) of etch features in an etch layer disposed below a functionalized organic mask layer disposed below an intermediate mask layer, disposed below a patterned photoresist mask, which forms a stack is provided. The intermediate mask layer is opened by selectively etching the intermediate mask layer with respect to the patterned photoresist mask. The functionalized organic mask layer is opened. The functionalized organic mask layer opening comprises flowing an open gas comprising COS, forming a plasma, and stopping the flowing of the open gas. The etch layer is etched.

14 Claims, 6 Drawing Sheets

BI-LAYER, TRI-LAYER MASK CD CONTROL

BACKGROUND OF THE INVENTION

The present invention relates to etching an etch layer through a mask during the production of a semiconductor device. More specifically, the present invention relates to controlling critical dimension (CD) of etch features during the production of semiconductor devices.

During semiconductor wafer production, features of the semiconductor device are defined by a patterned mask.

To provide increased density, feature size is reduced. This may be achieved by reducing the CD of the features, which requires improved resolution, precision and accuracy.

SUMMARY OF THE INVENTION

To achieve the foregoing and in accordance with the purpose of the present invention a method for controlling CD of etch features in an etch layer disposed below a functionalized organic mask layer disposed below an intermediate mask layer, disposed below a patterned photoresist mask, which forms a stack is provided. The intermediate mask layer is opened by selectively etching the intermediate mask layer with respect to the patterned photoresist mask. The functionalized organic mask is opened. The functionalized organic mask layer opening comprises flowing an open gas comprising COS, forming a plasma, and stopping the flowing of the open gas. The etch layer is etched.

In another manifestation of the invention, a method of controlling CD of etch features in a functionalized organic layer, which is below an intermediate mask layer, which is below a patterned photoresist mask is provided. The intermediate mask layer is opened with respect to the patterned photoresist mask. The functionalized organic layer is etched, comprising the steps of flowing an etching gas comprising COS, forming a plasma and stopping the flowing of the etching gas.

In another manifestation of the invention, an apparatus for controlling CD of etch features in an etch layer disposed below a functionalized organic mask layer disposed below an intermediate mask layer, disposed below a patterned photoresist mask, which forms a stack is provided. A plasma processing chamber is provided, comprising a chamber wall forming a plasma processing chamber enclosure, a substrate support for supporting a wafer within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, a gas outlet for exhausting gas from the plasma processing chamber enclosure. A gas source is in fluid connection with the gas inlet and comprises an intermediate mask layer opening gas source, a COS gas source, and an etch layer etch gas source. A controller is controllable connected to the gas source and the at least one electrode and comprises at least one processor and computer readable media. The computer readable media comprises computer readable code for opening the intermediate mask layer, computer readable code for opening the functionalized organic mask layer, comprising computer readable code for flowing an open gas comprising COS flowed from the COS gas source, computer readable code for forming a plasma from the open gas mixture, and computer readable code for stopping the flow of the open gas into the processing chamber before the etch layer is completely etched. The computer readable media further comprises computer readable code for etching the etch layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
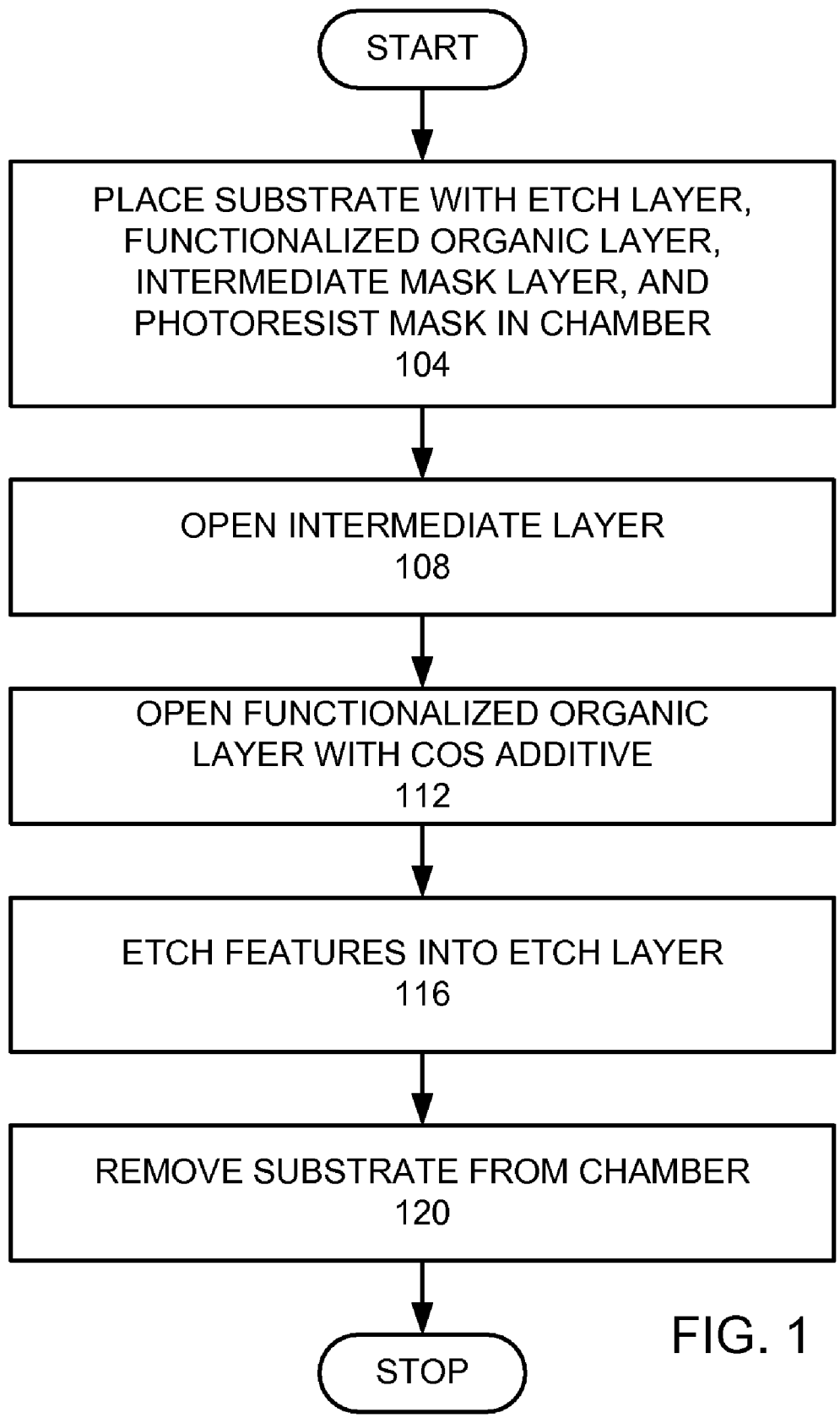
FIG. 1 is a high level flow chart of an embodiment of the invention.

To facilitate understanding, FIG. 1 is a high level flow chart of a process used in an embodiment of the invention. A substrate with an etch layer over which is a functionalized organic layer over which is an intermediate mask layer over which is a patterned photoresist mask is placed in an etch chamber (step 104). The intermediate mask layer is opened (step 108). The functionalized organic layer is opened using an opening gas with an additive of COS (carbonyl sulfide) (step 112). Features are etched into the etch layer through the functionalized organic layer (step 116). The substrate is then removed from the etch chamber (step 120).

Figure 2:
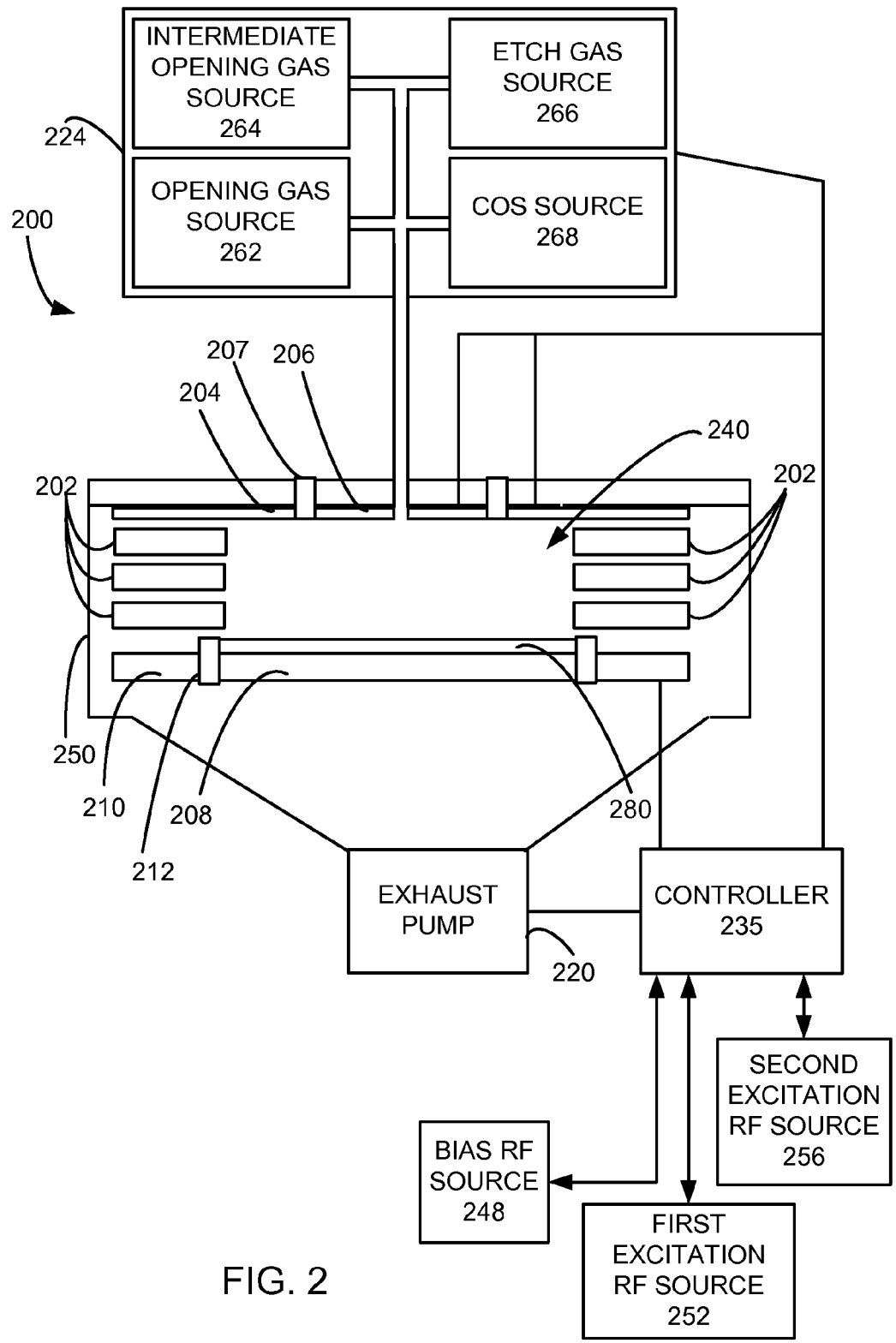
FIG. 2 is a schematic view of a plasma processing chamber that may be used for etching.

FIG. 2 is a schematic view of an etch reactor that may be used in practicing the invention. In one or more embodiments of the invention, an etch reactor 200 comprises a top central electrode 206, top outer electrode 204, bottom central electrode 208, and a bottom outer electrode 210, within a chamber wall 250. A top insulator ring 207 insulates the top central electrode 206 from the top outer electrode 204. A bottom insulator ring 212 insulates the bottom central electrode 208 from the bottom outer electrode 210. Also within the etch reactor 200, a substrate 280 is positioned on top of the bottom central electrode 208. Optionally, the bottom central electrode 208 incorporates a suitable substrate chucking mechanism (e.g., electrostatic, mechanical clamping, or the like) for holding the substrate 280.

A gas source 224 is connected to the etch reactor 200 and supplies the etch gas into a plasma region 240 of the etch reactor 200 during the etch processes. In this example, the gas source 224 comprises an opening gas source 262, an intermediate mask layer opening gas source 264, an etch gas source 266, and a COS source 268, which provide the gases used for controlling the CD features, in one example. The CD controlling process may be used to shrink CD.

A bias RF source 248, a first excitation RF source 252, and a second excitation RF source 256 are electrically connected to the etch reactor 200 through a controller 235 to provide power to the electrodes 204, 206, 208, and 210. The bias RF source 248 generates bias RF power and supplies the bias RF power to the etch reactor 200. Preferably, the bias RF power has a frequency between 1 kilo Hertz (kHz) and 10 mega Hertz (MHz). More preferably, the bias RF power has a frequency between 1 MHz and 5 MHz. Even more preferably, the bias RF power has a frequency of about 2 MHz.

The first excitation RF source 252 generates source RF power and supplies the source RF power to the etch reactor 200. Preferably, this source RF power has a frequency that is greater than the bias RF power. More preferably, this source RF power has a frequency that is between 10 MHz and 40 MHz. Most preferably, this source RF power has a frequency of 27 MHz.

The second excitation RF source 256 generates another source RF power and supplies the source RF power to the etch reactor 200, in addition to the RF power generated by the first excitation RF source 252. Preferably, this source RF power has a frequency that is greater than the bias RF source and the first RF excitation source. More preferably, the second excitation RF source has a frequency that is greater than or equal to 40 MHz. Most preferably, this source RF power has a frequency of 60 MHz.

The different RF signals may be supplied to various combinations of the top and bottom electrodes. Preferably, the lowest frequency of the RF should be applied through the bottom electrode on which the material being etched is placed, which in this example is the bottom central electrode 208.

The controller 235 is connected to the gas source 224, the bias RF source 248, the first excitation RF source 252, and the second excitation RF source 256. The controller 235 controls the flow of the etch gas into the etch reactor 200, as well as the generation of the RF power from the three RF sources 248, 252, 256, the electrodes 204, 206, 208, and 210, and the exhaust pump 220.

In this example, confinement rings 202 are provided to provide confinement of the plasma and gas, which pass between the confinement rings and are exhausted by the exhaust pump.

Figure 3A:
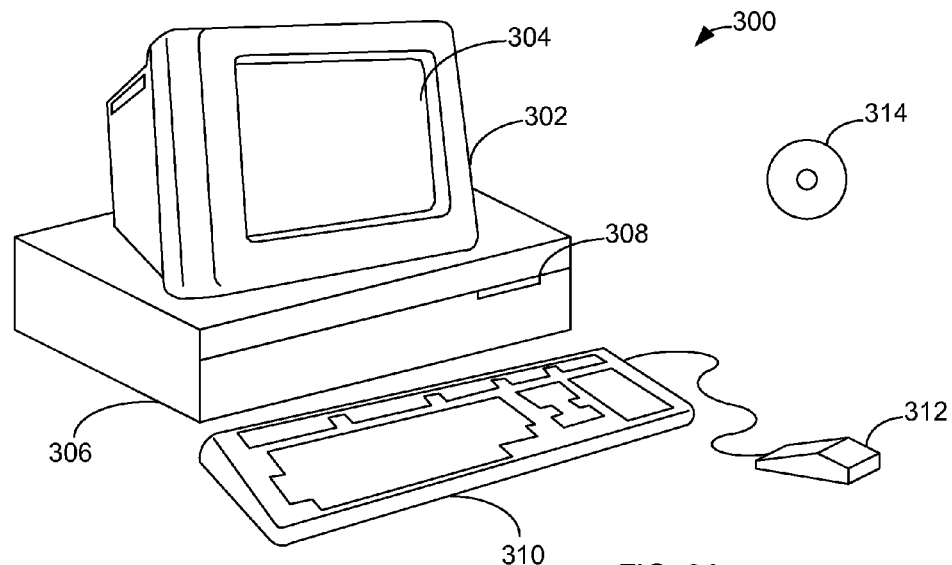
FIGS. 3A-B illustrate a computer system, which is suitable for implementing a controller used in embodiments of the present invention.
Figure 3B:
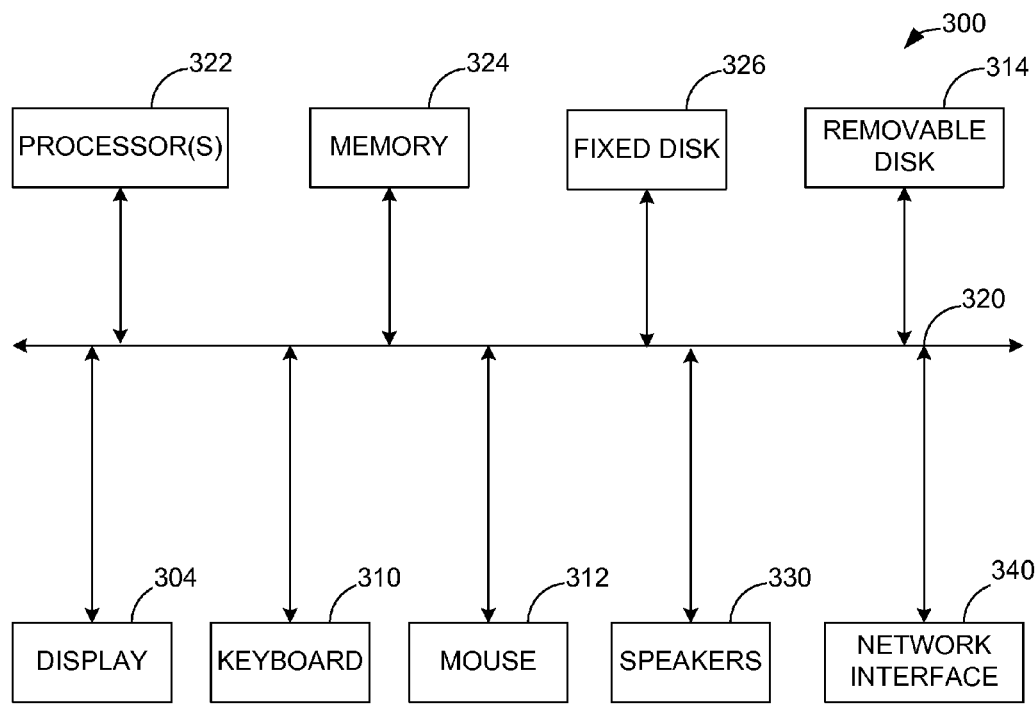

FIGS. 3A and 3B illustrate a computer system, which is suitable for implementing the controller 235 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

EXAMPLES

Figure 4A:
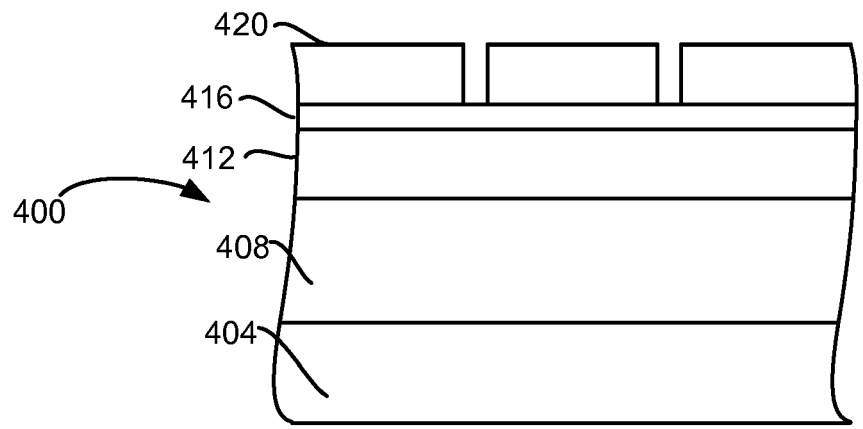
FIGS. 4A-D are schematic views of a stack processed according to an embodiment of the invention.

To facilitate understanding of the invention, in an example of a tri-layer mask, FIG. 4A is a schematic cross-sectional illustration of a stack 400, with a substrate 404, over which an etch layer 408 is provided, over which a functionalized organic layer 412 is provided, over which an intermediate mask layer 416 is provided, over which a patterned photoresist mask 420 is provided. In this embodiment of the invention, the substrate 404 is a silicon wafer and the etch layer 408 is a dielectric layer, such as a doped or undoped silicon oxide. In this embodiment of the invention, the functionalized organic layer 412 is a polymer, which does not include amorphous carbon. In this embodiment of the invention, the intermediate mask layer 416 is a silicon containing organic anti-reflective coating (SiARC).

Figure 4B:
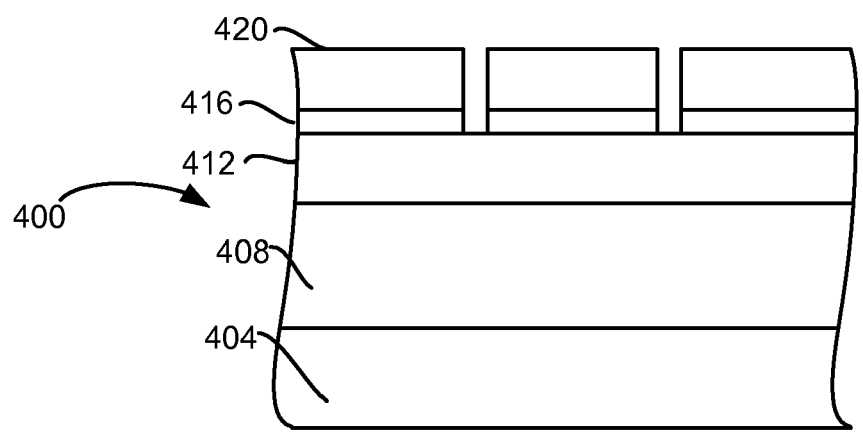

The substrate 404, etch layer 408, functionalized organic layer 412, intermediate mask layer 416, and patterned photoresist mask 420 are placed in the etch reactor 200 (step 104). The intermediate mask layer 416 is selectively opened through the patterned photoresist mask 420 to pattern the intermediate mask layer 416, with respect to the patterned photoresist mask as shown in FIG. 4B (step 108).

A typical recipe to etch or open an intermediate mask layer provides an opening gas comprising 100 sccm $CF_4$, 75 sccm $CHF_3$, 6 sccm $O_2$ at a pressure of 100 mTorr into the chamber. 800 watts at 60 MHz RF is provided to form the opening gas into a plasma. When the intermediate mask layer is opened, the flow of the opening gas is stopped. Generally, a fluorocarbon gas is used in the opening gas for the intermediate mask layer.

Figure 5:
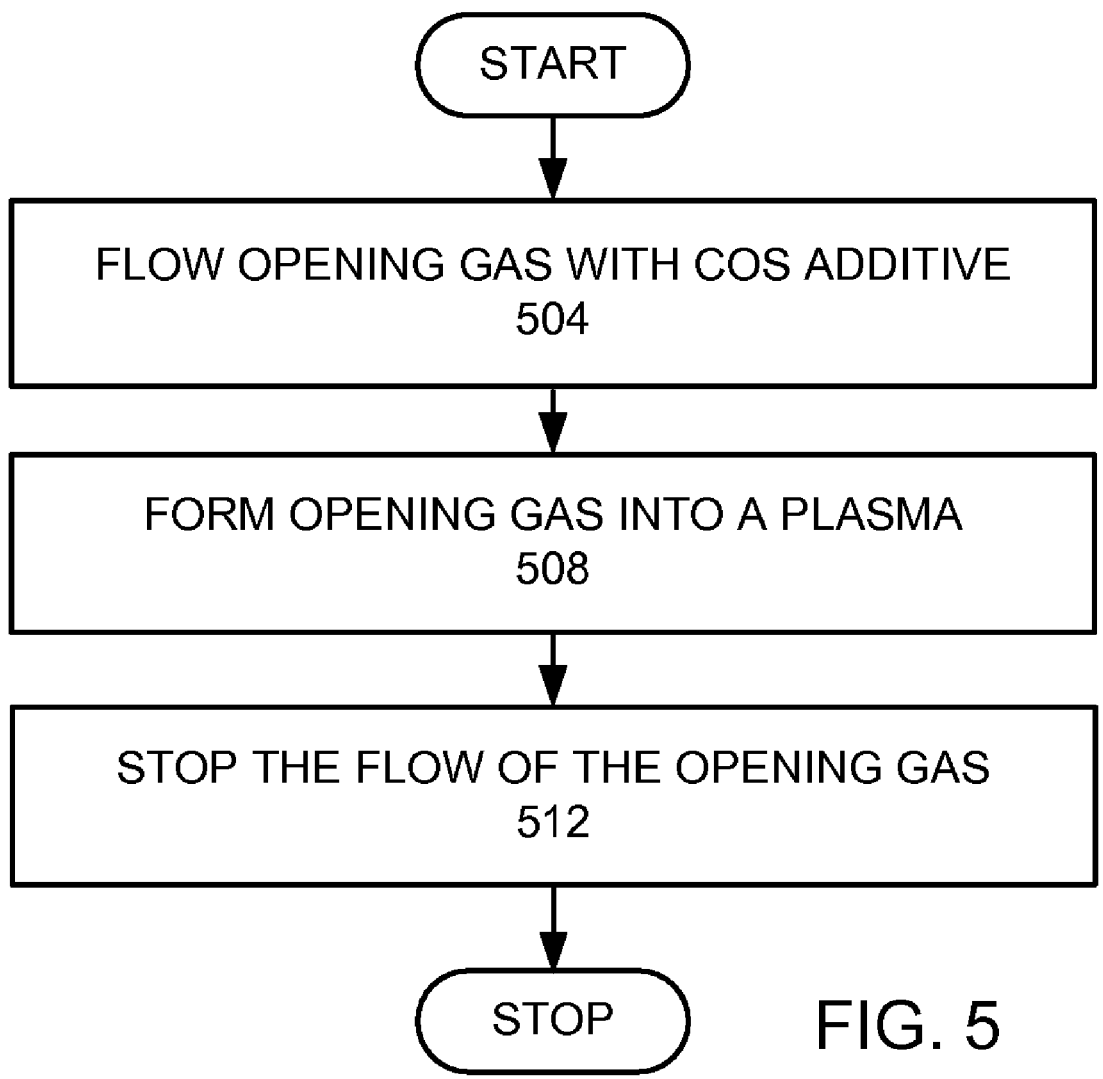
FIG. 5 is a more detailed flow chart of a step of opening a functionalized organic layer with a COS additive.

The functionalized organic layer is etched or opened using an opening gas with a COS additive (step 112). FIG. 5 is a more detailed flow chart of the step of opening the functionalized organic layer using a COS additive. An opening gas with a COS additive is flowed into the etch chamber (step 504). In this example, an opening gas comprising 400 sccm $N_2$, 400 sccm $H_2$, 20 sccm COS at a pressure of 40 mTorr is provided to the chamber.

In another example of a functionalized organic layer opening gas a gas of 100 sccm $N_2$, 20 sccm $O_2$, and 20 sccm COS is provided at a pressure of 20 mTorr. In this example, the ratio of the flow of the COS to the total flow of the opening gas is 1:41 and 1:7, respectively. Preferably the ratio of the flow of the COS to the total flow of the opening gas is between 1:2 and 1:160. More preferable, the ratio of the flow of the COS to the total flow of the opening gas is 1:3 to 1:80. Most preferably, the ratio of the flow of the COS to the total flow of the opening gas is 1:5 to 1:50. In addition, the opening gas would have an $O_2$ or a $CO_2$ or a $NH_3$ or a $N_2$ or a CO, and $H_2$ component used to open an organic material.

Figure 4C:
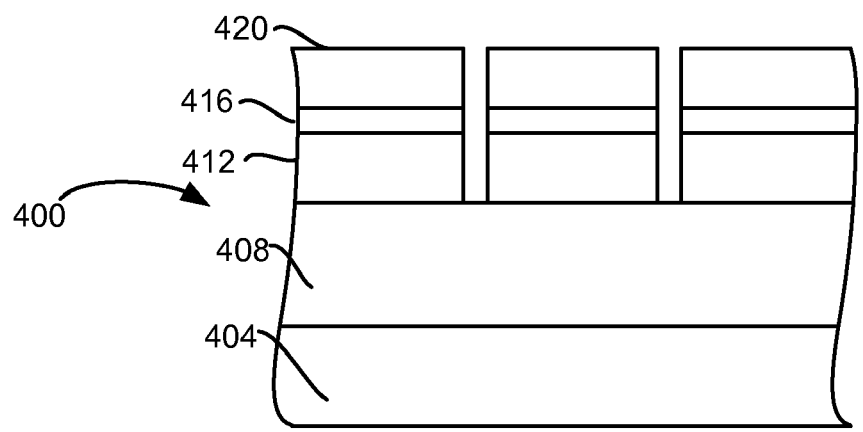

The opening gas is formed into a plasma (step 508). 600 watts at 60 MHz RF is provided to form the COS containing gas into a plasma. In this example, the plasma is a steady state plasma without gas modulation. In an embodiment of the invention the COS forms organic sidewalls on sidewalls of the features. The plasma is used to selectively open the functionalized organic layer with respect to the intermediate mask layer. FIG. 4C is a schematic cross sectional view of the stack 400 after the opening process has opened features into the functionalized organic layer 412. Once the features are opened in the functionalized organic layer 412, the flow of the opening gas with COS additive is stopped (step 512). Most likely, during this step, the patterned photoresist (PR) layer gets completely removed. During this process, the substrate chucking mechanism may be maintained at any temperature. Preferably, the substrate chucking mechanism temperature is maintained at greater than 5° C. More preferably, the substrate chucking mechanism temperature is maintained at greater than 20° C. Most preferably, the substrate chucking mechanism temperature is maintained at greater than 60° C. Although embodiments of the invention may work at lower substrate temperatures, it is believed that other processes do not work at such high temperatures.

Features are etched into the etch layer through the opened functionalized organic layer (step 116). The recipe used depends on the type of material that has to be etched. For TEOS, BPSG, low-k dielectric, FSG, SiN, etc. different process recipes may be required.

In one example, the functionalized organic layer opening gas is halogen free. Whether halogen is used depends on the material of the functionalized organic layer. A halogen free opening gas is able to open a functionalized organic layer containing no silicon. In another example, where the functionalized organic layer has a silicon component, the opening gas has a halogen component. The halogen composition has to be properly adjusted in order to have enough selectivity to the intermediate mask layer (416).

Figure 4D:
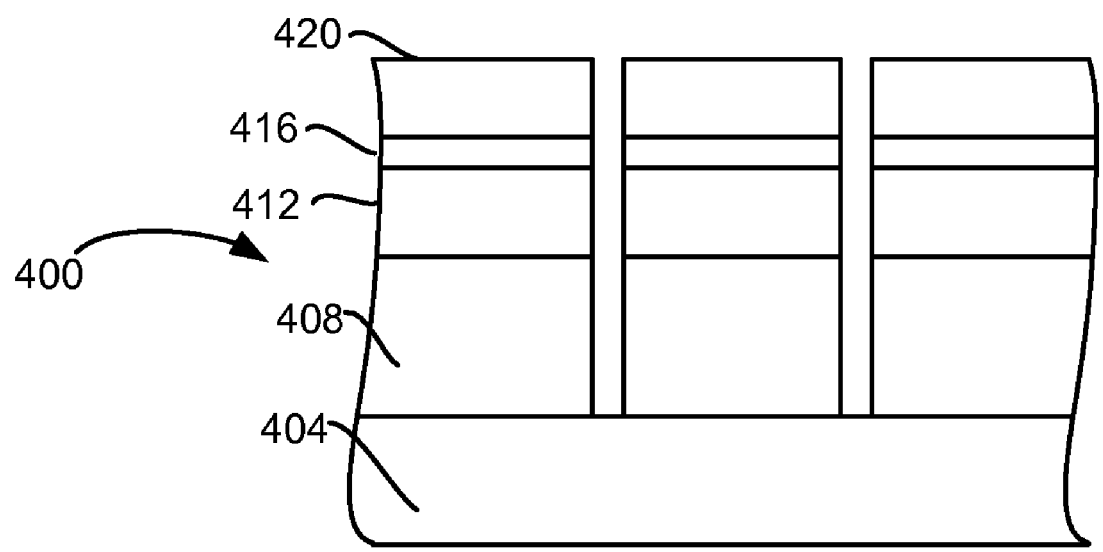

FIG. 4D is a schematic cross-sectional view of the stack after the features have been etched into the etch layer 408. The intermediate mask layer 416 may be the same material or may have similar etch properties as the etch layer 408. Because the functionalized organic layer 412 has different etch properties than the etch layer 408, the etch layer 408 is selectively etched with respect to the functionalized organic layer 412.

In other embodiments of the invention, the etch layer may be un-doped or doped silicon dioxide based material (e.g. TEOS, BPSG, FSG etc), organo-silicate glass (OSG), porous OSG, silicon nitride based material, silicon oxynitride based material, silicon carbide based material, low-κ dielectric or any metal gate or metal mask material.

Preferably, the intermediate mask layer is a silicon containing organic anti-reflective coating (SiARC). Preferably, the intermediate mask layer and the etch layer have similar etch properties. Preferably, the functionalized organic layer may be selectively etched with respect to the intermediate mask layer and the etch layer may be selectively etched with respect to the functionalized organic layer. More preferably, selectivity between the intermediate layer and the functionalized organic layer is larger than 4. Most preferably, selectivity between the intermediate layer and the functionalized organic layer is larger than 6. Because the functionalized organic layer is soft having similar etch properties as photoresist, it is difficult to obtain a high etch selectivity with respect to the intermediate mask layer and maintain CD. The use of COS in an embodiment of the invention provides such a high selectivity, while either maintaining or shrinking CD. Preferably, the functionalized organic layer and patterned photoresist mask have the same etch properties. More preferably, the functionalized organic layer is made of a photoresist material without photo-sensitive material.

Embodiments of the invention may be used to etch various features such as lines, trenches, and contacts. Preferably, the invention provides an etching process where the etch features are contacts.

In other examples the etch layer is at least one of a silicon dioxide based material, organo-silicate glass, a silicon nitride based material, a silicon oxynitride based material, silicon carbide based material, silicon or poly-silicon material, titanium nitride, titanium, tantalum nitride, tungsten, polymer, oxide, an inorganic or organic based low-κ material (such as SiLK®™, manufactured by The Dow Chemical Company), or any metal gate or metal mask material.

In another embodiment, the functionalized organic layer is the etch layer, over which an intermediate mask layer patterned is provided, over which a patterned photoresist mask 420 is provided. In this example, the functionalized organic layer is etched through the intermediate mask layer, where the functionalized organic layer is not used as a mask for etching another layer.

Without being bound by theory, it is believed that the COS additive provides a coating or changes the surface of the functionalized organic mask layer that provides subsequent etch protection.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for controlling critical dimension (CD) of etch features in an etch layer disposed below a functionalized organic mask layer disposed below an intermediate mask layer, disposed below a patterned photoresist mask, which forms a stack, comprising:
   opening the intermediate mask layer by selectively etching the intermediate mask layer with respect to said patterned photoresist mask;
   opening the functionalized organic mask layer, wherein the functionalized organic mask layer is a polymer which does not include amorphous carbon, comprising:
      flowing an open gas comprising COS;
      forming a plasma;
      stopping the flowing of the open gas; and etching the etch layer.

2. The method, as recited in claim 1, further comprising maintaining a substrate chucking mechanism temperature to be greater than 5° C.

3. The method, as recited in claim 1, wherein the intermediate mask layer is a silicon containing organic anti-reflective coating (ARC).

4. The method, as recited in claim 1, wherein the etch layer comprises at least one of oxide, titanium nitride, organosilicate glass.

5. The method, as recited in claim 1, wherein the etch layer is of a dielectric material and the etch features are contacts.

6. The method, as recited in claim 1, further comprising:
   placing the stack in a plasma processing chamber before opening the intermediate mask layer;
   removing the stack from the plasma processing chamber after etching the etch layer.

7. The method, as recited in claim 1, wherein the opening the functionalized mask layer shrinks the CD of the etch features.

8. A method for controlling CD of etch features in a functionalized organic layer, disposed below an intermediate mask layer, disposed below a patterned photoresist mask, which forms a stack, comprising:
   opening the intermediate mask layer with respect to the patterned photoresist mask;
   etching the functionalized organic layer, wherein the functionalized organic layer is a polymer which does not include amorphous carbon, comprising:
      flowing an etching gas comprising COS;
      forming a plasma; and stopping the flowing of the etching gas.

9. The method, as recited in claim 8, further comprising maintaining a substrate chucking mechanism temperature to be greater than 5° C.

10. The method, as recited in claim 8, wherein the intermediate mask layer is a silicon containing organic anti-reflective coating (ARC).

11. The method, as recited in claim 8, wherein the etch layer comprises at least one of oxide, titanium nitride, organosilicate glass.

12. The method, as recited in claim 8, wherein the etch layer is of a dielectric material and the etch features are contacts.

13. The method, as recited in claim 8, further comprising:
   placing the stack in a plasma processing chamber before opening the intermediate mask layer; and
   removing the stack from the plasma processing chamber after etching the functionalized organic layer.

14. The method, as recited in claim 8, wherein the etching the functionalized organic layer shrinks the CD of the etch features.

* * * * *